United States Patent [19]
Hofer

[11] 4,009,399
[45] Feb. 22, 1977

[54] GATED RAMP GENERATOR

[75] Inventor: Bruce Edward Hofer, Beaverton, Oreg.

[73] Assignee: Tektronix, Inc., Beaverton, Oreg.

[22] Filed: Feb. 5, 1976

[21] Appl. No.: 655,584

Related U.S. Application Data

[63] Continuation of Ser. No. 512,633, Oct. 7, 1974, abandoned.

[52] U.S. Cl. .............................. 307/228; 328/183; 328/184
[51] Int. Cl.² .......................................... H03K 4/08
[58] Field of Search .......... 307/228; 328/181, 183, 328/184

[56] References Cited

UNITED STATES PATENTS

| 3,543,049 | 11/1970 | Farnsworth | 307/228 |
| 3,621,282 | 11/1971 | Haas | 307/228 |
| 3,708,692 | 1/1973 | Matuoka | 307/228 |
| 3,723,762 | 3/1973 | Nakaya | 307/228 |

*Primary Examiner*—Stanley D. Miller, Jr.
*Attorney, Agent, or Firm*—Kenneth M. Durk

[57] ABSTRACT

A precision ramp voltage generator is provided which exhibits exceptionally small start-up aberrations and simultaneously maintains baseline stability. The perturbations in the output are corrected by an increase or decrease in an error current developed via feedback means to charge or discharge a timing capacitor in the direction necessary to maintain the desired baseline, whereas start-up aberrations are minimized by effecting a very fast current switch to a timing element from a current source to a current sink of greater magnitude.

5 Claims, 4 Drawing Figures

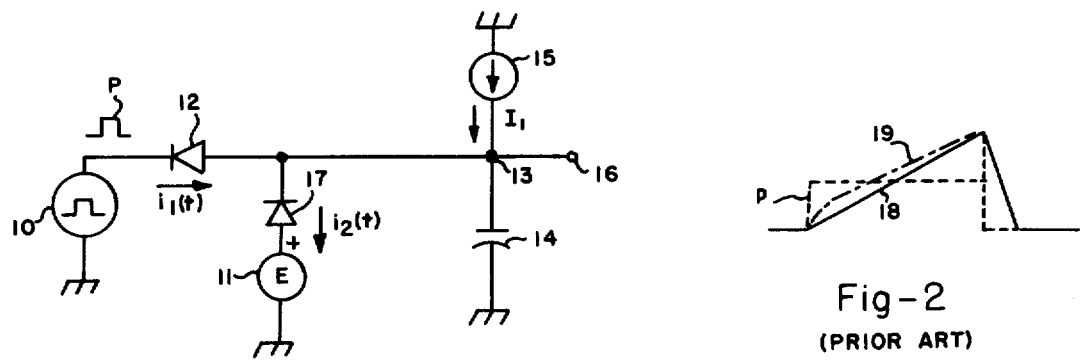
Fig-1 (PRIOR ART)
Fig-2 (PRIOR ART)
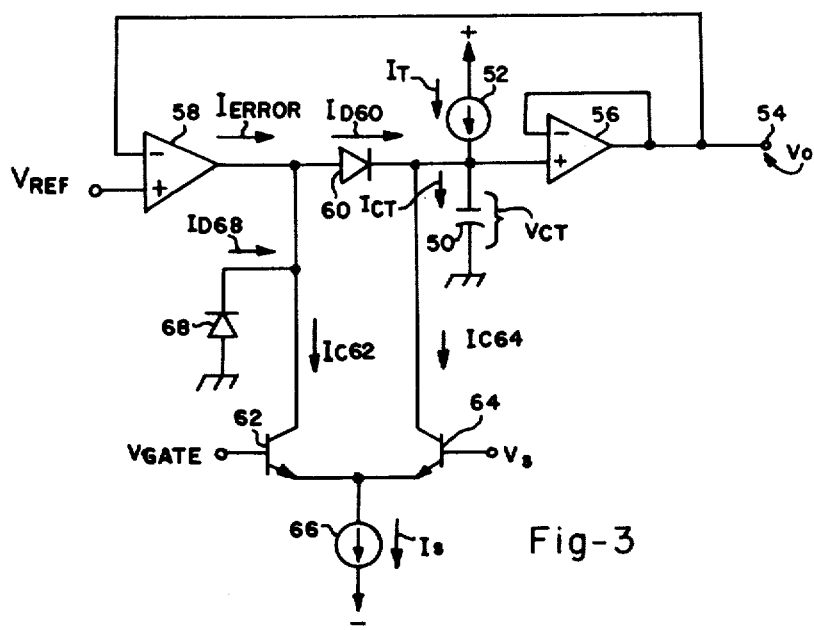
Fig-3
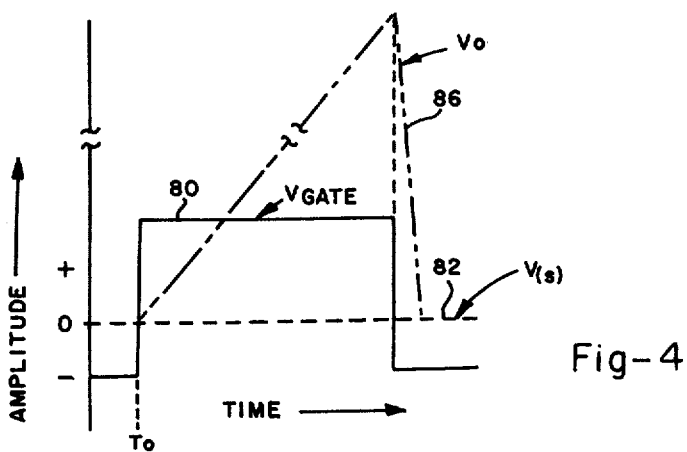
Fig-4

GATED RAMP GENERATOR

This is a continuation of application Ser. No. 512,633 filed October, 7, 1974, now abandoned.

BACKGROUND OF INVENTION

In an apparatus such as an oscilloscope or related equipment for precision testing or measurement of an electrical phenomenon, the phenomenon is ordinarily displayed as a visual plot of the instantaneous voltage of a wave as a function of time. In most cases, the time reference is supplied by the apparatus itself. For example, a sweep generator develops a sawtooth, or ramp, voltage which after being processed in a horizontal amplifier is applied to the horizontal deflection plates of the cathode-ray-tube (CRT), producing the horizontal sweep. When the voltage required to produce a linear unit of beam displacement (i.e., deflection factor) and the ramp voltage rate of rise are known quantities, the horizontal dimensions of any waveform traced on the CRT face plate can be converted to units of time.

If precise time measurements are to be made, it is essential that equal increments of horizontal distance represent equal increments of time. If the displacement of the electron beam is at all times proportional to the voltage applied to the horizontal deflection plates, it must follow that the sweep voltage change at a linear rate. Additionally, the electron beam must be returned to a quiescent position else, apparent positional shifts of the displacement of the electron beam occurs.

Thus, two important requirements for precision ramp generators are the stability of the baseline voltage prior to initiation of the ramp waveform and the lack of aberrations following initiation of the ramp.

Basically, all ramp generators for generating ramp voltages generate the ramp voltage by charging and discharging of a capacitor by a charging current. Previous schemes for baseline stabilization have limited the charging current to a particular valve thus requiring longer times for recovery from negative transients such as discharge overshoot. Start-up aberrations, due to the time interval to effectively switch current into the timing capacitor have been reduced by other schemes such as overdriving an emitter coupled amplifier; however, such schemes also produce aberrations caused by stray and device capacitances.

SUMMARY OF THE INVENTION

The present invention overcomes the limitations of the prior art ramp or sawtooth voltage generators in that simultaneously, baseline stabilization and start-up aberrations are maintained at a constant quiescent position and at a linear rate, respectively.

In the most basic essence, the present invention provides a ramp voltage generator which comprises a timing element or capacitor into which a timing current and an error current are alternately driven to charge and discharge the element to produce the ramp voltage. A current sink for sinking the timing current and the error current is provided via an emitter coupled pair operated as a gate in accordance with a gating signal. A pair of bipolar or asymmetrical conducting devices such as diodes are included with the gating components to steer the error current and provide an additional current path.

It is therefore an object of the present invention to provide an improved ramp voltage generator that can eliminate the limitations described above.

It is another object of the present invention to provide an improved ramp voltage generator that can simultaneously eliminate the limitations described above.

The foregoing and numerous other objects, advantages, and inherent functions of the present invention will become apparent as the same is more fully understood from the following description, which describes the preferred embodiment of the present invention; it is to be understood, however, that this embodiment is not intended to be limiting nor exhausting of the invention, but is given for purposes of illustration in order that others skilled in the art may fully understand the invention and principles thereof and the manner of applying it in practical use so that they may modify it in various forms, each as may best be suited to the conditions of the particular use.

DESCRIPTION OF DRAWINGS

In the drawings:

FIG. 1 is one embodiment of the prior art for generating a linear ramp voltage wave;

FIG. 2 shows the waveforms associated with the embodiment of the prior art in accordance with FIG. 1;

FIG. 3 is the preferred embodiment of the ramp voltage generator according to the present invention; and FIG. 4 shows the waveforms associated with the embodiment of the present invention in accordance with FIG. 3.

DETAILED DESCRIPTION OF THE INVENTION

Referring now to the drawings and in particular FIG. 1, there is shown a particular ramp voltage generator according to the prior art for eliminating some of the limitations that have previously been discussed; such particular embodiment being the invention of U.S. Pat. No. 3,723,762 by N. NaKaya. The ramp voltage generator comprises a capacitor 14 and a switching diode 12. Diode 12 is used to charge and discharge capacitor 14 so as to utilize the terminal voltage across the capacitor as the ramp voltage waveform. A signal source 10, for producing a switching signal P, has one terminal grounded and the other terminal connected to the cathode electrode of switching diode 12, the anode electrode thereof being connected to the junction 13 between the output of a source of charging current 15 and one terminal of capacitor 14. The polarity of source 15 is selected such that current $I_1$ flows into capacitor 14 via juncture 13. The other terminal of capacitor 14 is grounded and the juncture 13 is connected to an output terminal 16. As is well known, in the absence of the switching signal P from source 10, current $I_1$ flows from source 15 via the diode 12 into source 10. With switching signal P, the switching diode 12 is reversed biased allowing current $I_1$ to charge the capacitor 14. As is well known, an exponential reverse current $I_1(t)$, due to stored charge, now flows into the juncture 13 so that the capacitor also charges in response thereto. The effect of the additional exponential current produces the ramp voltage waveform 19 as shown in FIG. 2 along with the switching singal P. As can be discerned from FIG. 2, waveform 19 is not linear and contains start-up aberrations. To overcome these limitations, a series circuit including a source of constant voltage 11 and a second diode 17 is connected in parallel with capacitor 14. The polarity of the second diode 17 and the positive terminal of constant voltage source 11 are connected together so that diode 17 is rendered conductive in the absence of the switching signal P from signal source 10. If both diodes have similar characteristics, an additional exponential current $I_2(t)$ will be produced which will flow in the direction shown when the switching pulse P is applied. As a result, the exponential currents effectively cancel each other and the ramp voltage waveform 18 is produced. However, start-up aberrations, uncertainties due to temperature, diode mismatch, etc. still remain.

In U.S. Pat. No. 3,621,282 by C. H. Haas there is described a sawtooth generator including a bistable comparator to compare the ramp voltage and a reference voltage for discharging a capacitor across which the ramp voltage is being produced to provide a stabilized ramp. However, the output of such a circuit will not return to a precise reference in that the output of the comparator can shift substantially due to parameters of the comparator.

In the preferred embodiment of the present invention detailed in FIG. 3, there is shown a gated ramp voltage generator to further improve the limitations of the prior art previously discussed as well as simultaneously maintaining the baseline at a reference level. The gated ramp voltage generator comprises a capacitor 50 which is charged and discharged so as to provide the ramp voltage waveform. A timing current source 52 is connected between a source of suitable potential (+) and one terminal of the capacitor 50 such that a current $I_{CT}$ flows into the capacitor 50; the other terminal of the capacitor is grounded. Current into or out of capacitor 50 produces a terminal voltage $V_{CT}$ thereacross which is supplied to an output terminal 54 by way of an amplifier 56 which has its noninverting input also connected to the ungrounded terminal of capacitor 50 and its inverting input connected to its single output terminal and the output terminal 54; such amplifier thus connected as a voltage follower amplifier. As such, the output ramp voltage waveform at the ouput terminal 54 is defined conventionally by $(dVo/dt) = (I_T/C_T,)$ where $(dVo/dt)$ is the first derivative or linear ramp of the timing current $I_T$ charging the capacitor 50 ($C_T$ in the above formula corresponds to the capacitor 50). Connected to output terminal 54 is a next amplifier 58 which compares the ouput ramp voltage waveform Vo applied to its inverting input and a reference voltage, $V_{REF}$, applied to its non-inverting input during quiescent time. It should be noted that the voltage $V_{REF}$ is usually of the magnitude equal to the magnitude of the level desired for the baseline of the ramp voltage which is typically zero volts. The single output of amplifier 58 is therefore an error current controlled by the difference between the output ramp voltage Vo and the reference voltage, $V_{REF}$. Connected between the ungrounded terminal of capacitor 50 and the output of amplifier 58 is an asymmetrical conducting device or unipolar device such as a diode 60 and poled so as to allow a current $I_{D60}$ to flow in the direction shown when biased in the forward direction.

A pair of transistors 62, 64 have their emitters connected together, which are connected to a source of suitable potential (shown as - in the drawing) via a series connected current sink 66 for sinking the current $I_s$ in the direction shown. The collectors of the transistors 62, 64 are connected to the anode and cathode of the diode 60 respectively, and the bases thereof are connected to a gate source $V_{GATE}$ and a voltage source $V_s$. The generator circuit is completed by a diode 68 having its cathode connected to the collector of transistor 62 and having its anode connected to ground.

Referring now to FIG. 4 which details the waveforms associated with the present invention, there is shown a waveform 80 which represents the gate source $V_{GATE}$. When $V_{GATE}$ is at least several tenths of a volt more negative than the voltage source $V_s$ (82 on drawing), transistor 64 conducts all of the current Is. (Transistors 62, 64 are connected in the well known differential manner and no discussion will be given as to their operation.) Since transistor 64 is conducting all of current Is, the voltage $V_{CT}$ across capacitor 50, hence Vo at the output terminal 54 moves under the influence of $I_{CT}$ where, using Kirchoff current law is defined by:

$I_{CT} = I_T + I_{D60} -$ Is where $I_T$, $I_{D60}$ and Is are as previously defined. By selecting Is greater than $I_T$ (i.e., Is $>I_T$), $I_{D60}$ will be controlled by the difference between Vo and $V_{REF}$ until $I_{CT} = 0$. When $I_{CT} = 0$, Vo ~ is approximately equal to $V_{REF}$, and no net current is available to charge or discharge capacitor 50. Vo is thus established at a potential close to $V_{REF}$. I, now becomes evident that under the above described conditons $I_{ERROR} = I_{D60} = I_{D68} - I_T$. Perturbations in Vo are corrected by an increase or decrease in $I_{ERROR}$ causing $I_{CT}$ to assume a non-zero value which charges or discharges capacitor 50 in the direction necessary to restore the correct baseline. This technique represents a significant improvement over the prior art because capacitor 50 may be discharged and charged by a current many times greater than the current $I_T$ rather than limited by $I_T$ which would require longer times for recovery from negative transients etc., such as discharge overshoot.

At a time, $t_0$, to gate the ramp 86 on, gate source $V_{GATE}$ is switched from a potential several tenths of a volt more negative than voltage source Vs to a potential several tenths of a volt more positive than the voltage source Vs. During this transition period $$Is = I_{C62} + I_{C64}.$$

and $$I_{D60} = I_{ERROR} - I_{C62}$$

$$I_{CT} = I_T + I_{D60} - I_{C64} = I_T + I_{ERROR} - Is.$$

Recalling once again that prior to transition, $I_{ERROR} =$ Is $- I_T$, it must follow that $I_{CT} = 0$. As such, no net current is charging or discharging capacitor 50. When a reduction of current $I_{C64}$ is reduced to a point where $I_{C64} = I_T$, then $I_{D60} = 0$. Conduction through diode 60 ceases and changes in $I_{ERROR}$ will no longer affect $I_{CT}$. Diode 68 now conducts preventing transistor 62 from saturating. As a result, $I_{CT} = I_T - I_{C64}$ and $V_{CT}$, hence Vo begin to rise. As current $I_{C64}$ is dropping to zero the ramp voltage rises at a slower rate than ideal for the interval of time when $I_T > I_{C64} > 0$. By selecting Is much greater than $I_T$ (i.e., Is $>> I_T$) such interval will only be a fraction of the actual risetime of $V_{GATE}$ thus effecting a very fast and "clean" current switch for capacitor 50. Thus, the present invention is an improvement over prior art in which the time interval taken to effectively switch current into the timing capacitor is essentially limited by the gating waveform risetime; or the loop bandwidth, for the particular case of operational integrator ramp generator schemes such as "Miller Integrators".

While there has been shown and described the preferred embodiment of the present invention, it will now be apparent to those skilled in the art that many changes and modifications may be made without departing therefrom in its broader aspects. Therefor, the appended claims are intended to cover all such modifications and changes as fall within the true spirit and scope of this invention.

The invention is claimed in accordance with the following:

1. A gated ramp voltage generator, comprising:
    a current source for providing a first current;
    capacitor means connected to said current source for developing the ramp voltage thereacross in response to current applied thereto;
    comparator means having a first input coupled to receive the ramp voltage and a second input connected to a reference voltage source, said comparator means producing a second current at the output thereof which is proportional to the difference in amplitude between the ramp voltage and said reference voltage; and
    current steering means coupled to both said capacitor means and said comparator means for steering to said capacitor means said first and said second currents to produce the ramp voltage, said current steering means including means for gating said first and said second currents to cause the ramp voltage developed to be a gated ramp voltage.

2. The generator according to claim 1 further comprising a voltage follower amplifier means disposed between said first input and said capacitor for coupling the ramp voltage to said comparator means.

3. The generator according to claim 1 where said second current maintains the base line level of the ramp voltage.

4. The generator according to claim 1 wherein said current steering means including means for gating further comprises:
    current sink means for sinking substantially more current than both said first and said second currents;
    differential amplifier means including first and second transistors having their emitters coupled to said current sink means for selectively steering both said first and said second currents to said current sink means;
    unipolar device means coupled between the collectors of said first and said second transistors and also being directly coupled between said capacitor means and said output of said comparator means for selectively steering both said first and said second currents to said capacitor means; and
    control means for controlling the bases of said transistors to gate said first and said second currents to said capacitor means.

5. The generator according to claim 4 further comprising an additional unipolar device means coupled to one of said collectors for preventing saturation thereof.

* * * * *